United States Patent
Verma et al.

(10) Patent No.: US 9,391,220 B2
(45) Date of Patent: Jul. 12, 2016

(54) SYSTEM AND METHOD FOR INTERFACING LARGE-AREA ELECTRONICS WITH INTEGRATED CIRCUIT DEVICES

(75) Inventors: Naveen Verma, Princeton, NJ (US); Branko Glisic, Princeton, NJ (US); James Sturm, Princeton, NJ (US); Sigurd Wagner, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 1062 days.

(21) Appl. No.: 13/367,856

(22) Filed: Feb. 7, 2012

(65) Prior Publication Data

US 2012/0200168 A1 Aug. 9, 2012

Related U.S. Application Data

(60) Provisional application No. 61/440,274, filed on Feb. 7, 2011, provisional application No. 61/440,278, filed on Feb. 7, 2011, provisional application No. 61/525,048, filed on Aug. 18, 2011, provisional application No. 61/539,247, filed on Sep. 26, 2011.

(51) Int. Cl.
*H01F 38/14* (2006.01)
*H02J 4/00* (2006.01)
*H01L 31/0392* (2006.01)

(52) U.S. Cl.
CPC ........... *H01L 31/03926* (2013.01); *Y02E 10/50* (2013.01); *Y10T 29/49124* (2015.01)

(58) Field of Classification Search
CPC ................................................ H01L 31/03926
See application file for complete search history.

(56) References Cited

U.S. PATENT DOCUMENTS

| | | | | |
|---|---|---|---|---|
| 6,637,906 B2* | 10/2003 | Knoerzer et al. | ............... | 362/84 |
| 7,739,568 B1* | 6/2010 | Bertanzetti | .................. | 714/729 |
| 2002/0100941 A1* | 8/2002 | Yonehara | ............ | H01L 21/3063 |
| | | | | 257/359 |
| 2004/0112964 A1* | 6/2004 | Empedocles et al. | ......... | 235/491 |
| 2005/0079659 A1* | 4/2005 | Duan et al. | .................... | 438/197 |
| 2006/0169989 A1* | 8/2006 | Bhattacharya et al. | ......... | 257/79 |
| 2006/0176179 A1* | 8/2006 | Skorpik et al. | ............. | 340/572.8 |
| 2008/0252409 A1* | 10/2008 | Kojima | ......................... | 336/185 |
| 2009/0227205 A1* | 9/2009 | Rofougaran | ................. | 455/41.1 |

OTHER PUBLICATIONS

S. Kim, S. Pakzad, D. Culler, J. Demmel, G. Fenves, S. Glaser, and M. Turon, "Health Monitoring of Civil Infrastructures Using Wireless Sensor Networks", Proc. of the 6th International Conference on Information Processing in Sensor Networks (IPSN '07), Cambridge, MA, 2007, ACM Press, pp. 254-263.

(Continued)

*Primary Examiner* — Jared Fureman
*Assistant Examiner* — Joel Barnett
(74) *Attorney, Agent, or Firm* — Meagher Emanuel Laks Goldberg & Liao, LLP

(57) ABSTRACT

A system and method for interfacing large-area electronics with integrated circuit devices is provided. The system may be implemented in an electronic device including a large area electronic (LAE) device disposed on a substrate. An integrated circuit IC is disposed on the substrate. A non-contact interface is disposed on the substrate and coupled between the LAE device and the IC. The non-contact interface is configured to provide at least one of a data acquisition path or control path between the LAE device and the IC.

24 Claims, 17 Drawing Sheets

(56) References Cited

OTHER PUBLICATIONS

S. N. Pakzad, S. Kim, G.L. Fenves, S.D. Glaser, D.E. Culler, and J.W. Demmel, "Multi-Purpose Wireless Accelerometers for Civil Infrastructure Monitoring", Proc. of the 5th International Workshop on Structural Health Monitoring (IWSHM '05), Stanford, CA, 2005, ed. F-K Chang, pp. 125-132.

K.J. Loh, T.C. Hou, J.P. Lynch, and N.A. Kotov, "Nanotube-based Sensing Skins for Crack Detection and Impact Monitoring of Structures", Proc. of the 6th Intl. Workshop on Structural Health Monitoring (IWSHM '06), Stanford, CA, 2007.

D. Zonta, A. Chiappini, A. Chiasera, M. Ferrari, Matteo Pozzi, L. Battisti, and M. Benedetti, "Photonic crystals for monitoring fatigue phenomena in steel structures", Proceedings of SPIE vol. 7292: Sensors and Smart Structures Technologies for Civil, Mechanical, and Aerospace Systems 2009, Ed. M. Tomizuka, pp. 729215-01-729215-10.

P. Gorrn, M. Lehnhardt, W. Kowalsky, T. Riedl, and S. Wagner, "Elastically Tunable Self-Organized Organic Lasers", Advanced Materials, vol. 23, Issue 7, pp. 869-872, 2011.

Arias, AC, MacKenzie, JD, McCulloch, I, Rivnay, J, and Salleo, A. "Materials and applications for large area electronics: Solution-based approaches", Chem. Rev., 110(1): 3-24, 2010.

Chen, G, Fojtik, M, Kim, D, Fick, D, Park, J, Seok, M, Chen, M-T, Foo, Z, Sylvester, D, and Blaauw, D, "A millimeter-scale nearly-perpetual sensor system with stacked battery and solar cells", in Proc. Int. Solid-State Circuits Conference, Feb. 2010, pp. 288-289.

Glisic, B. "Streicker Bridge: an on-site SHM laboratory at Princeton University campus", SMAR, Paper No. 306, Dubai, UAE, 2011.

Glisic, B, and Oberste-Ufer, K. "Validation Testing of Fiber Optic Method for Buried Pipelines Health Assessment after Earthquake-Induced Ground Movement", Proceedings of 2011 NSF Engineering Research and Innovation Conference, Atlanta, GA, USA, 2011.

Someya, T, Sekitani, T, Iba, S, Kato, Y, Kawaguchi, H, and Sakurai, T. "A large-area, flexible pressure sensor matrix with organic field-effect transistors for artificial skin applications", Proc. National Academy of Science, 101(27): 9966-9970, Jul. 2004.

Someya, T, Pal, B, Huang, J, and Katz, HE. "Organic semiconductor devices with enhanced field and environmental responses for novel applications", MRS Bulletin, 33:690-696, 2008.

\* cited by examiner

SYSTEM AND METHOD FOR INTERFACING LARGE-AREA ELECTRONICS WITH INTEGRATED CIRCUIT DEVICES

CROSS-REFERENCE TO PRIOR FILED APPLICATION

This application claims priority to earlier filed U.S. provisional patent application No. 61/539,247 filed on Sep. 26, 2011, U.S. provisional patent application No. 61/525,048 filed on Aug. 18, 2011, U.S. provisional patent application No. 61/440,278 filed on Feb. 7, 2011 and U.S. provisional patent application No. 61/440,274 filed on Feb. 7, 2011, all of which are incorporated by reference herein in their entirety.

UNITED STATES GOVERNMENT RIGHTS

This invention was made with government support under Subaward from The Pennsylvania State University, Award No. 4349-PU-DOE-4261; Pennsylvania State University Prime Grant No. DE-EE0004261 awarded by the Department of Energy. The government has certain rights in this invention.

FIELD OF INVENTION

The present disclosure generally relates to interface circuitry between large-area electronics and integrated circuits and in more particular relates to thin-film transistor (TFT) based large-area electronics and complementary metal-oxide-semiconductor (CMOS) IC devices.

BACKGROUND

Large-area electronics is an emerging technology that offers a high degree of synthetic richness. It allows diverse materials to be incorporated on a wide-range of substrates. As a result, a broad set of transducers may be fabricated on plastic foil substrates that can be both flexible and capable of spanning large areas (i.e., tens of square meters). Such sensors may include: pressure sensors, particle sensors, vapor sensors, photovoltaics, piezoelectrics and the like. This allows for the manufacture of dense and expansive arrays of sensors that may be deployed on arbitrary, large-scale surfaces. Deeply-scaled integrated circuits ICs are available to provide computational capabilities. The evolution of such devices, e.g., complementary metal-oxide-semiconductor (CMOS) IC devices, has given rise to faster, lower-energy circuitry with increasing numbers of logic gates. There exists a need enable a self-powered system that will ultimately also exploit the possibility of energy-harvesting transducers in large-area electronics. This requires systems and methods that simultaneously allow the basic energy trade-offs of ICs to be accessed while also allowing the sensor scalability characteristics of large-area electronics to be accessed.

SUMMARY OF THE INVENTION

A system and method for interfacing large-area electronics with integrated circuit devices is provided. The system may be implemented in an electronic device including a large area electronic (LAE) device disposed on a substrate. An integrated circuit IC is disposed on the substrate. A non-contact interface is disposed on the substrate and coupled between the LAE device and the IC. The non-contact interface is configured to provide at least one of a data acquisition path or control path between the LAE device and the IC.

The LAE device may be a thin-film device. The non-contact interface may include an inductive and/or capacitive antenna. The LAE device may include a plurality of LAE sensors and an LAE scan chain configured to acquired data from the plurality of LAE sensors. The LAE device may include an LAE sensor configured to generate an alternating current (AC) sensor output and the IC may include a demodulator configured to demodulate the AC sensor output. An IC network may also be provided and configured to generate an AC bias for the LAE sensor. In one embodiment, the device includes a plurality of ICs. The LAE includes a communication path configured to support communication between the plurality of ICs.

The LAE device may be a sensor and/or an energy harvesting device. The device may include a plurality of strain-gauges disposed on the substrate in a 2 dimensional pattern. The LAE device may include an energy harvesting device and a sensor.

DETAILED DESCRIPTION OF THE INVENTION

Figure 1:
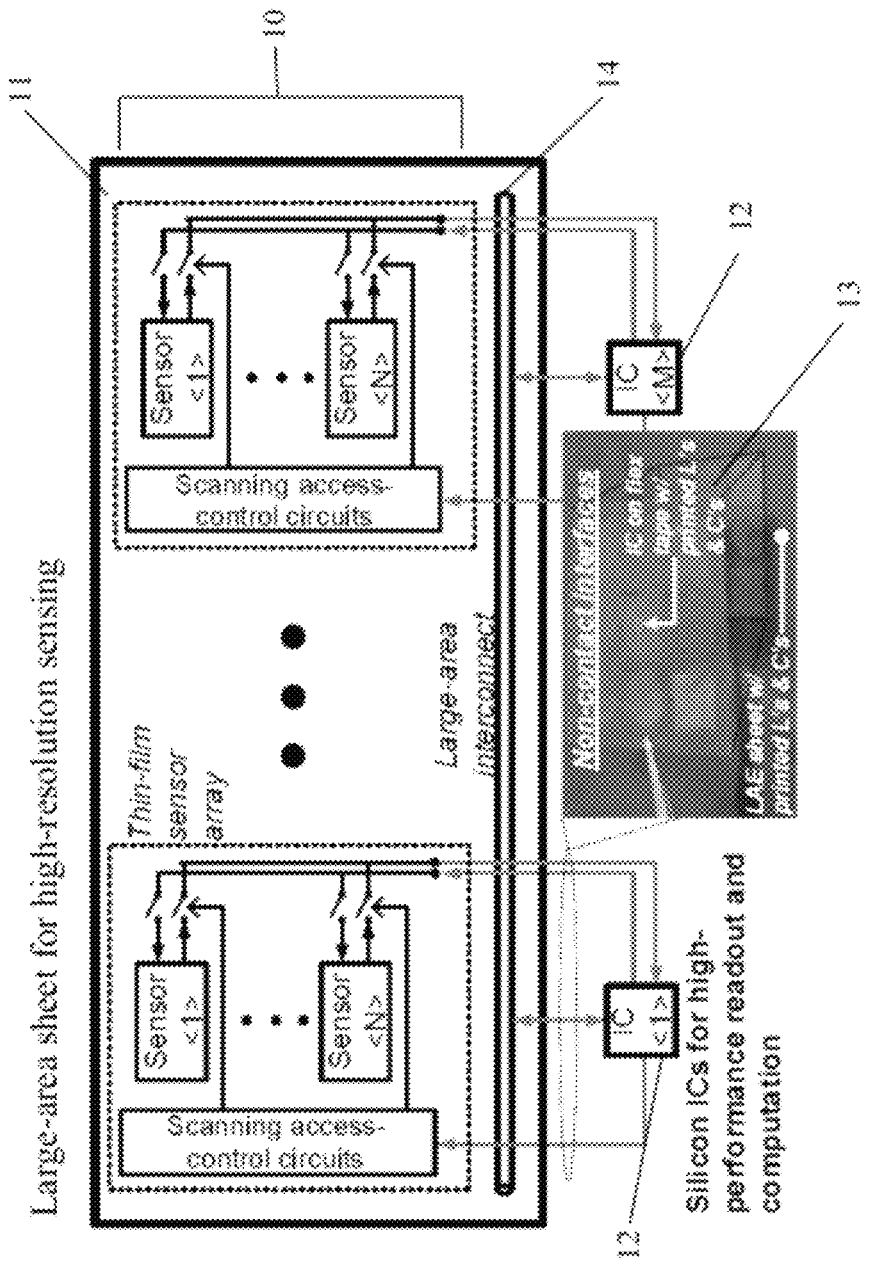
FIG. 1 is a block diagram showing a sensor-network-on-foil, configured for scalable sensing and high-performance computation, by combining processing integrated circuits (ICs) with a sensor network disposed on a flexible large area electronics (LAE) sheet.

Large-area electronics (LAE) are typically based on processing thin films at low temperatures. This allows a broad range of materials to be used for creating diverse transducers on large (>10 m$^2$), conformal substrates. Although, thin-film transistors (TFTs) are also possible, e.g., using organics, hydrogenated amorphous-silicon (a-Si:H), metal-oxides and the like, these have orders of magnitude lower performance and energy efficiency than crystalline silicon ICs. FIG. 1 shows a sensor-network-on-foil configured for scalable sensing and high-performance computation, by combining processing ICs 12 with a substrate (LAE sheet) 11. The substrate may be flexible, e.g., polyimide sheet, or rigid, e.g., glass. The system enables the strengths of the LAE sheet, namely scalable, low-cost, and conformal sensor integration, to be combined with the strengths of ICs, namely high-capacity, high-performance, and energy-efficient processing and computation. The sensor network includes a plurality of sensors (LAE) shown generally by reference number 10. The sensors 10 are disposed on the substrate 11. The sensors 10 are coupled to processing circuitry (ICs) 12 via interface 14. The IC's may be disposed on flex tape packaging 13. The IC-to-LAE interface 14 poses a primary limitation to system scalability. To overcome this, the interface 14 uses non-contact coupling. Interface 14 generally provides a data acquisition path and/or a control path between the LAE devices and the IC devices. For example, inductive and/or capacitive antennas may be patterned on both the substrate 11 and on the flex-tape packaging 13 of the ICs 12. Assembly may be achieved via sheet lamination, with typical adhesive thickness <100 μm. This configuration enables proximity coupling with low energy.

In this example, the sensors 10 may be strain gages. To substantially reduce the total number of signals required from the ICs 12, the substrate 11 may integrate TFT-based control and access circuits that enable sequential access to individual strain sensors in the array. The ICs 12 generally integrate instrumentation and signal-generation circuits for access control, AC biasing, and readout over the sensor array. For communication over the distributed sheet, the ICs 12 may use transceivers that exploit low-loss, large-area interconnects. The interconnect impedance substantially affects the energy and SNR of communication; the transmitters may self-calibrate to the resonant point of the interconnect, which is difficult to otherwise predict in a large-scale sheet.

Thin-film LAE Circuits for Sensor-Array Control

Figure 2:
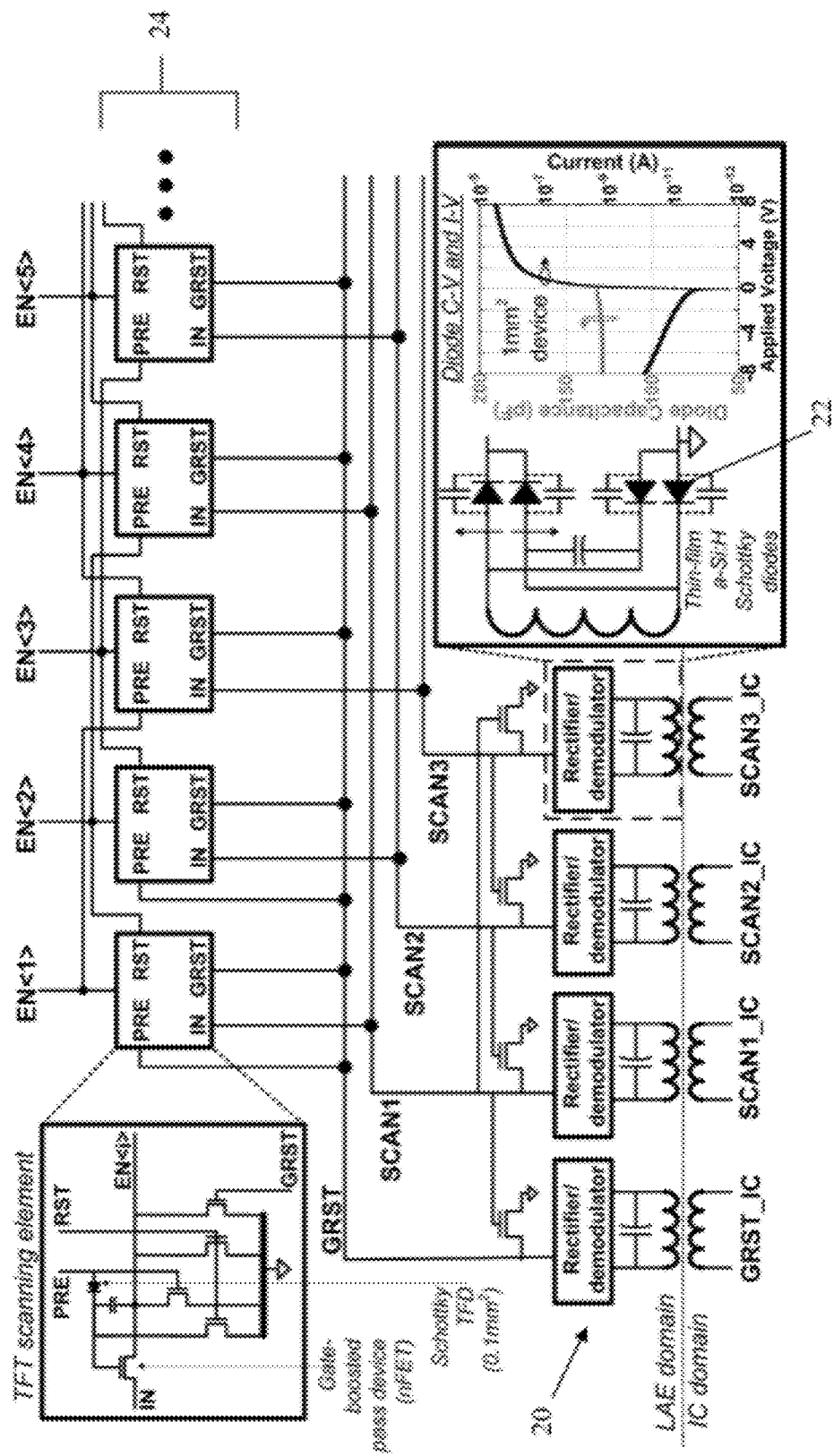
FIG. 2 is a block diagram showing an example of fully passive LAE circuits for data acquisition and/or control of sensors on the LAE sheet.

FIG. 2 shows an example of fully passive LAE interface circuits 20. Just four signals (GRST_IC, SCAN1_IC, SCAN2_IC and SCAN3_IC) are required from the IC domain for both power and control, to sequentially access the individual sensors. In this example, the LAE interface circuits 20 are fabricated using a-Si:H (a very stable LAE semiconductor). The mobility (1 cm$^2$/Vs) and unipolar (n-channel) nature of a-Si:H is similar to other LAE technologies (e.g., organics, oxides, etc.), making the topologies transferable.

In this example, the processing ICs and LAE circuits operate at different voltages. For example the processing ICs may operate at 1.2V, the LAE circuits may need over 6V for reasonable performance. The inductive interfaces, which require AC-modulated IC control signals, can provide voltage step-up. This, however, increases the power of the IC power amplifiers and/or requires high-Q inductors. Though thin-film diodes (TFDs) are possible, in this example a-Si:H Schottky TFDs 22 are used to demodulate the IC signals. Some advantages of a-Si:H Schottky TFDs are a low-voltage drop and good rectification characteristics. The measured I-V and capacitance curves are shown. In the full-wave rectifier configuration shown, the AC current through the TFD capacitances is cancelled since the inputs oscillate in counter phase. This enables rectification of high frequencies. In this example, the interfaces use a frequency of 2 MHz, yielding a quality factor of 126 for 2 cm planar inductors.

The scanning elements 24 form a scan chain that uses 3-phase control, with SCAN1-3 asserted in round-robin manner. The Nth scanning element receives a precharge signal (PRE) from the N−2 element and a reset signal (RST) from the N+1 element to control an nFET pass device (the first two elements are precharged by GRST). The sensor enable signals (EN<i>) are thus asserted one-at-a-time down the chain. Since only nFETs can readily be created using a-Si:H, capacitive bootstrapping is used on the pass device to preserve the 6V logic level throughout the circuit (this is achieved using the low-voltage-drop Schottky TFDs).

Instrumentation Circuits for Sensor Readout

Figure 3:
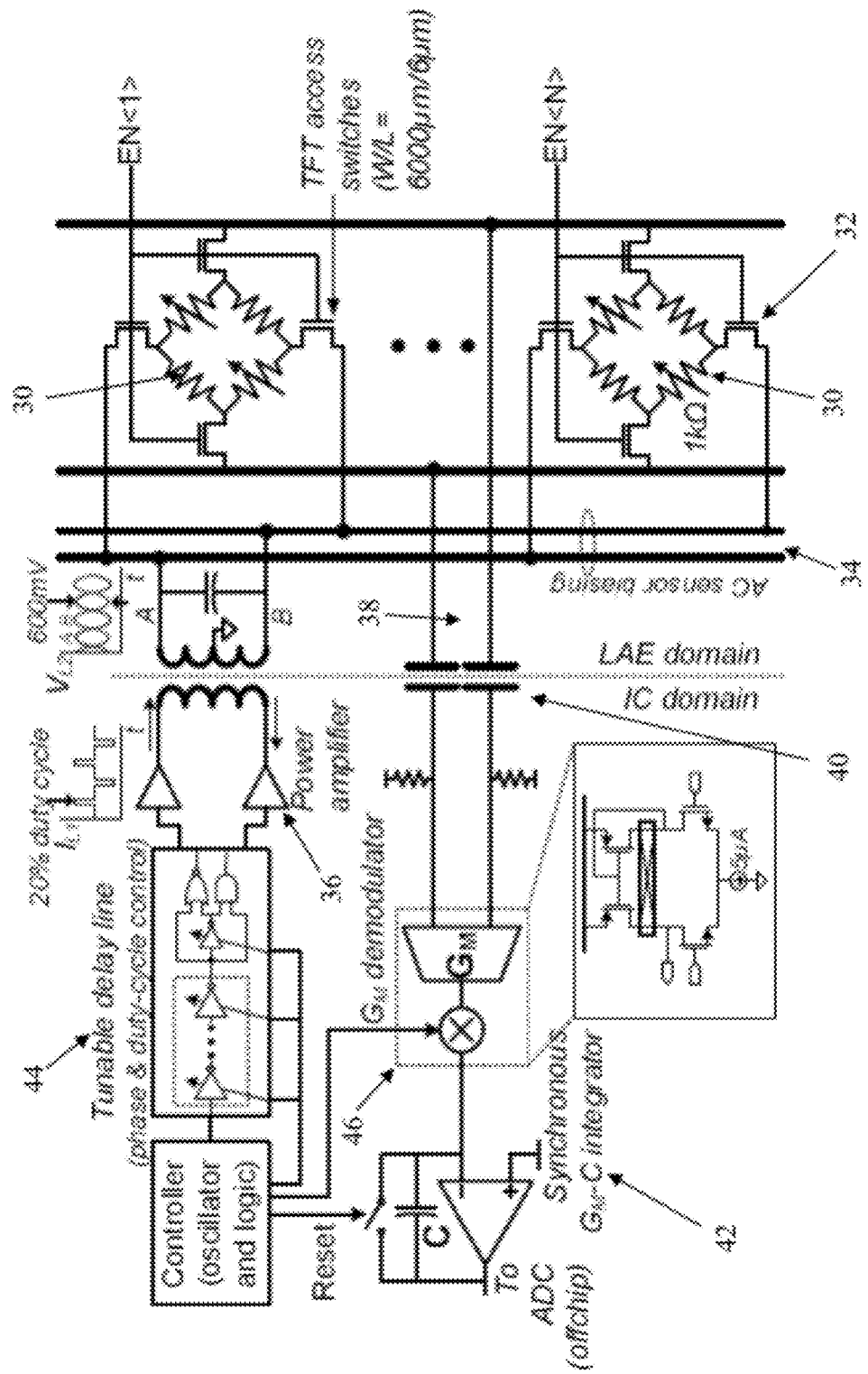
FIG. 3 is a block diagram showing a multi-sensor readout circuit.

FIG. 3 shows the multi-sensor readout circuit. Thin-film resistive strain gauges 30 are used. In this example, strain gauges 30 are calibrated for aluminum beams and have standardized resistance of 1 kΩ. Large access TFTs 32, which are controlled by the scanning circuits, gate the AC biasing signal 34 (VL2=0.6VAMP), which is provided by the ICs over the inductive interface discussed above. In this example, the IC's power amplifier (PA) 36 operates in class-C mode, rather than class-D, since the power required is relatively low for practical values of the frequency (5 MHz) and the patterned inductors (3.5 μH) (higher frequencies are limited by the parasitics of the access TFTs, and larger inductors are limited by physical size). The PA 36 duty cycle is optimized to 20%, yielding a measured efficiency of 82%. The AC-modulated sensor signal 38 is then acquired through a capacitive interface 40 (this results in reduced loading on the sensor bridge). Demodulation and readout is then performed via a synchronous GM-C integrator 42. Synchronization requires that the PA 36 have proper phase, which is thus achieved via a tunable delay line 44. The GM stage 46 demodulates the sensor signal for integration by integrator 42 (implemented with a low-power op-amp). Demodulation at the GM stage output mitigates 1/f noise and helps reject error signals of orthogonal phase that original from admittance mismatches in the branches of the sensor bridge.

Transceiver for Macro-Range Communication

Figure 4:
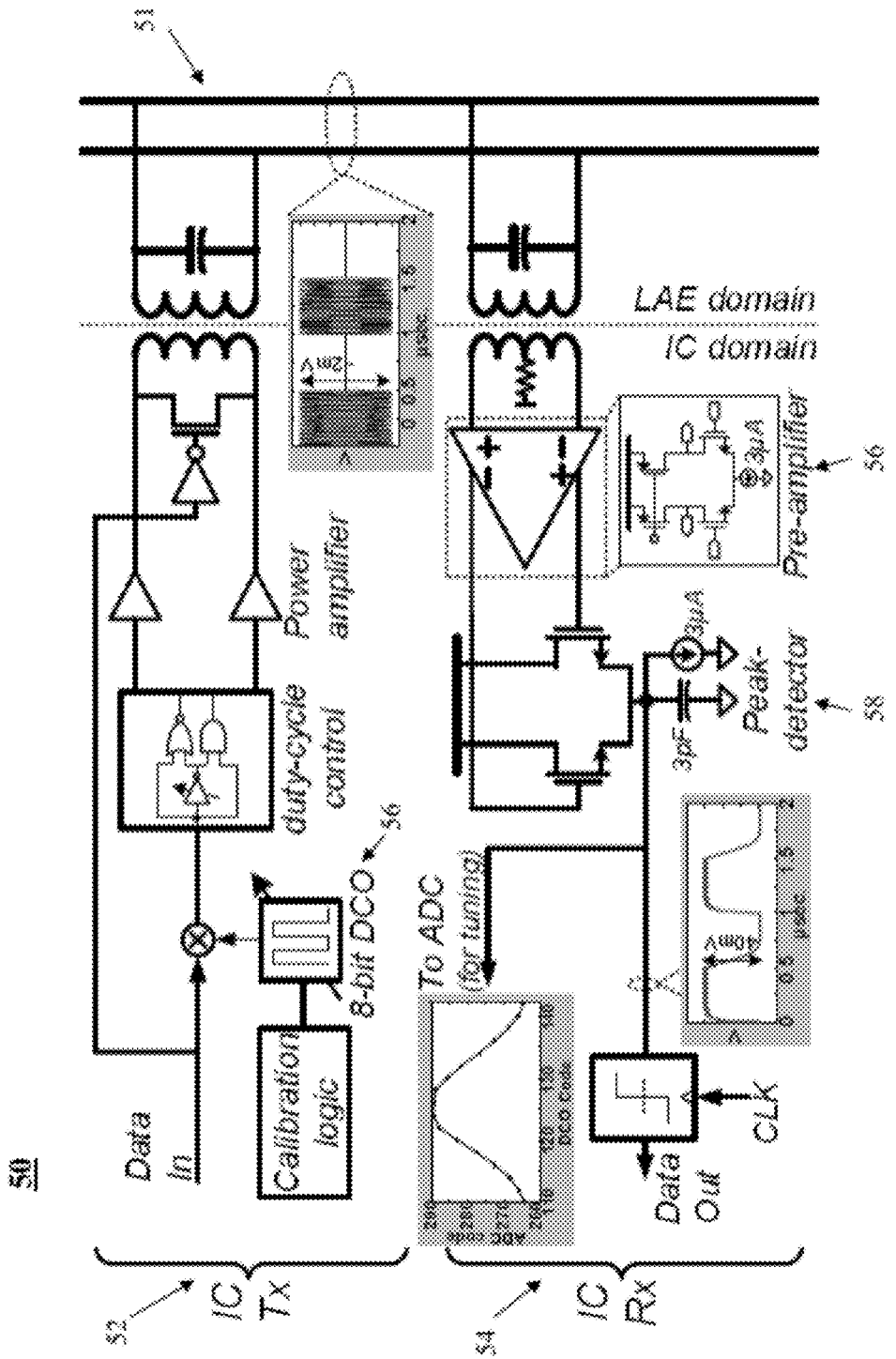
FIG. 4 is a block diagram showing a transceiver configured for communication over distributed ICs.

FIG. 4 shows a transceiver 50 configured for communication over distributed ICs. The transceiver includes a transmitter 52 and receiver 54. A communication path 51 is provided in the LAE domain. Previous efforts to exploit large-area interconnects have used pulsed signals and have been limited by the interconnect impedance. In this example, for strong coupling over the non-contact links, AC signaling is used with on-off keying. The severe and unpredictable interconnect impedance is overcome using an 8-bit digitally-controlled oscillator (DCO) 50 to self-tune the transmitter carrier frequency to the resonant point of the communication path 51, e.g., full interconnect network. The local receiver 54 self-senses the transmitted signal, allowing a DCO code to be selected via a gradient descent algorithm to result in the largest amplitude (a measured DCO sweep is shown). To recover digital data, the receiver 54 uses a preamplifier 56 and peak-detector 58, each biased with 3 μA. Synchronization and multiple access between transceivers can be achieved by digital-baseband processing (not included on chip).

Measurement Results

Figure 5:
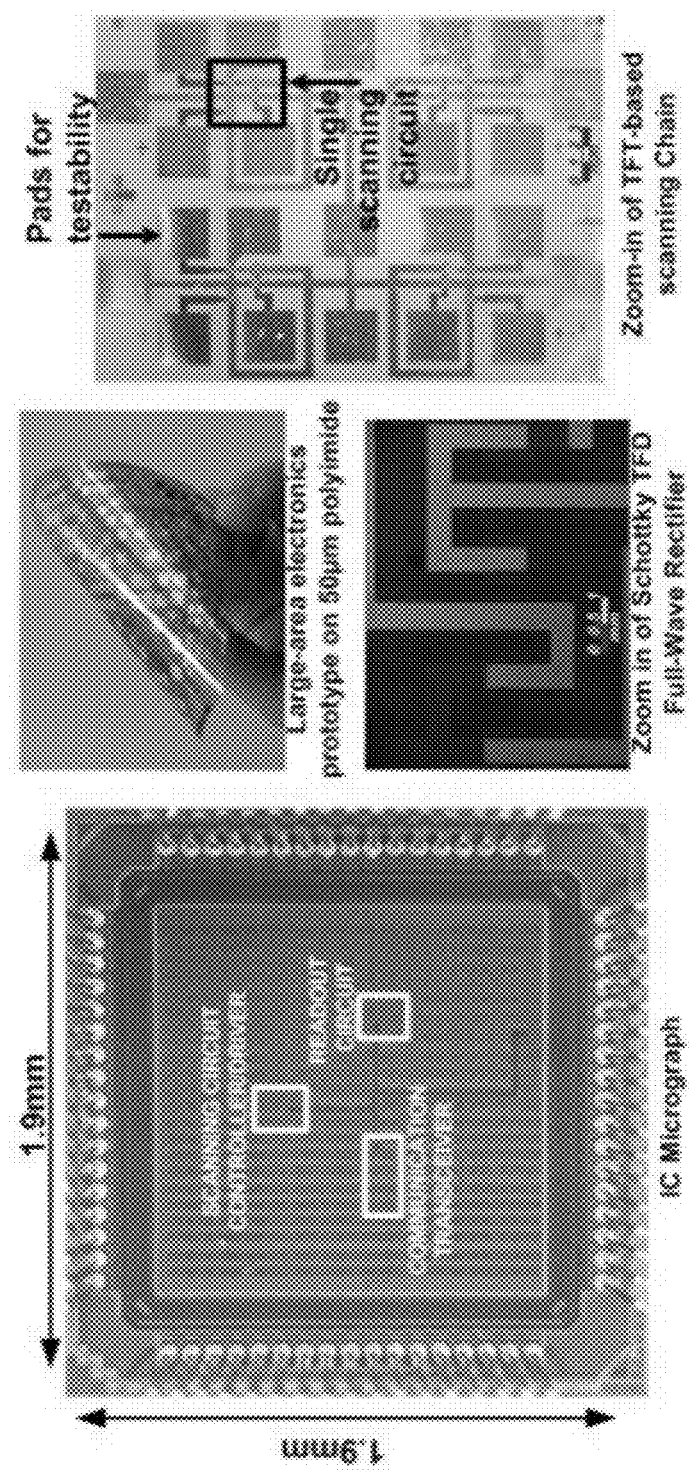
FIG. 5 shows prototype LAE and IC photographs.
Figure 6:
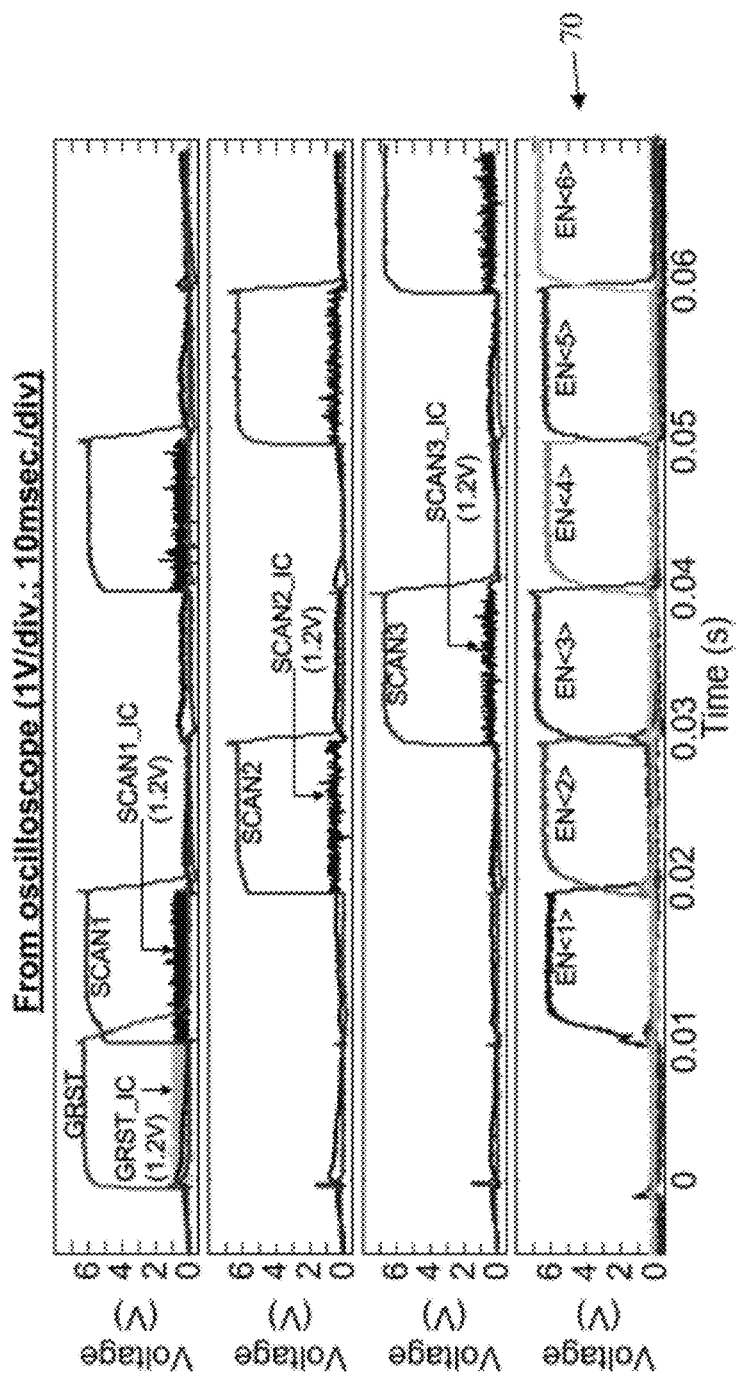
FIG. 6 is an oscilloscope graph showing measured waveforms, of LAE rectifier and scanning circuits generating digital enable signals from AC-modulated IC control signals.

In one embodiment, LAE circuits on were fabricated on 50 μm polyimide foil, and ICs were fabricated in 130 nm CMOS from IBM. FIG. 5 shows prototype photographs. FIG. 6 is an oscilloscope graph showing measured waveforms of the LAE rectifier and scanning circuits. Digital enable signals 70 (>6V) for the LAE are generated from 1.2V, AC-modulated IC control signals. The enable pulses can switch at a rate of 500 Hz, limited by the load capacitance of the TFT sensor-access switches (as shown in FIG. 3).

Figure 7:
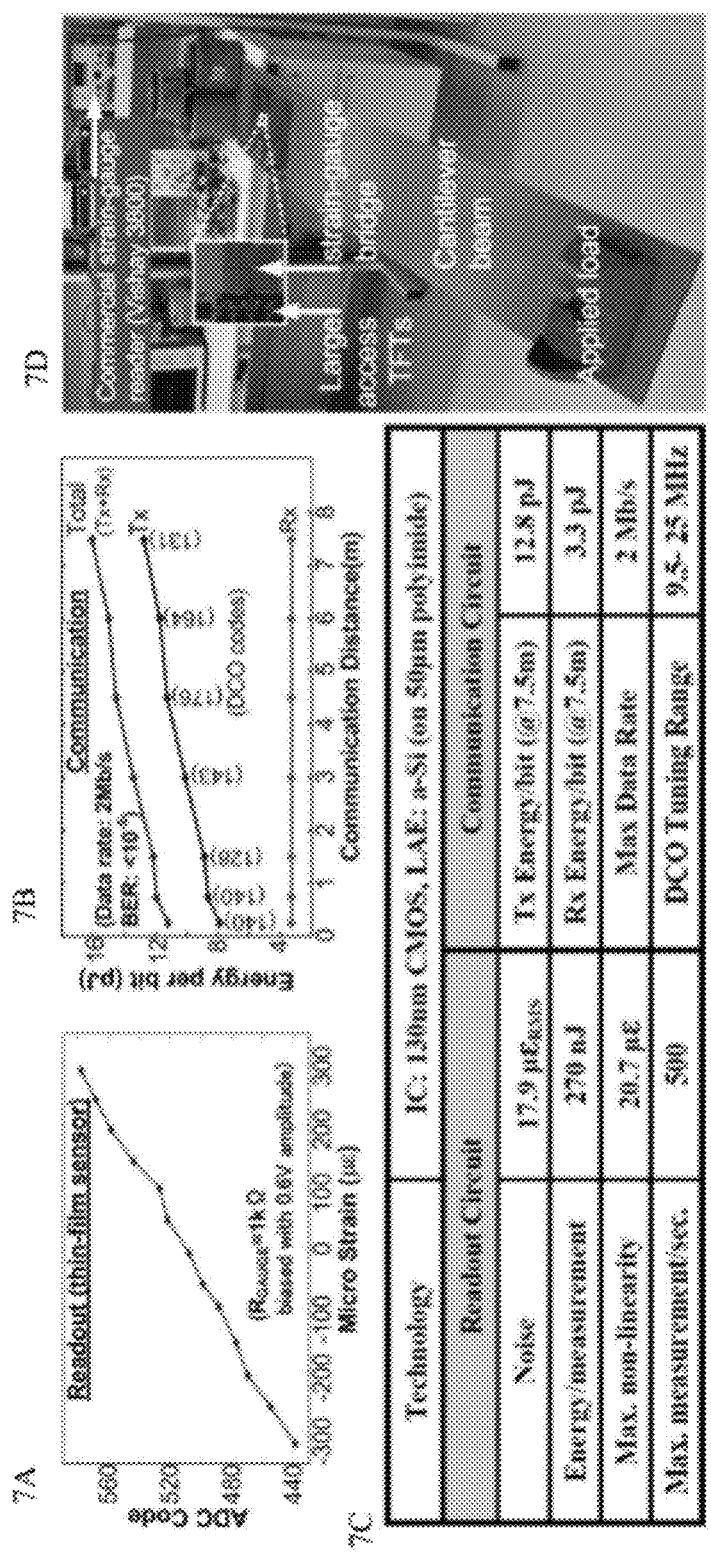
FIG. 7A is a graph that shows the ADC code verses micro strain for the test setup shown in FIG. 7D.
FIG. 7B is a graph that shows the energy per bit verses communication distance for the test setup shown in FIG. 7D.
FIG. 7C is a table that summarizes the measurements for the test setup shown in FIG. 7D.
FIG. 7D shows a test setup including a cantilever beam.

FIG. 7D shows a test setup. FIG. 7A is a graph that shows the ADC code verses micro strain for the test setup shown in FIG. 7D. FIG. 7B is a graph that shows the energy per bit verses Communication Distance for the test setup shown in FIG. 7D. FIG. 7C is a table that summarizes the measurements for the test setup shown in FIG. 7D. Readout-circuit outputs (digitized by an ADC) are shown for sensing applied to a 30 cm×180 cm cantilever beam (outputs are correlated with readings from a commercial strain reader, Vishay 3800). The total readout noise is 18μStrain$_{RMS}$, with an energy/measurement of 270 nJ for the readout circuit and 2.6 μJ for the scanning-circuit drivers. The energy/bit of the transceiver at 2 Mb/s (with BER<$10^{-5}$) is shown versus communication distance (Tx/Rx: 12.8/3.3 pJ@7.5 m), with the DCO codes given in parentheses.

It should be understood that the techniques disclosed above can be applied to other LAE devices. With the explosion in the number of battery-powered portable devices, ubiquitous powering stations that exploit energy harvesting can provide an extremely compelling means of charging. Disclosed herein is a system on a flexible sheet that, for the first time, integrates the power electronics using the same thin-film amorphous-silicon (a-Si) LAE technology as that used for established flexible photovoltaics. Such large-area flexible sheets could be used to cover everyday objects, to convert them into wireless charging stations. The approach combines thin-film circuits with flexible solar cells to provide embedded power inversion, harvester control, and power amplification. The system may convert DC outputs from the solar modules to AC power for wireless device charging through patterned capacitive antennas. In one embodiment with 0.5-2 nF transfer antennas and solar modules of 100 cm², the system provides 47-120 μW of power at 11-22% overall power-transfer efficiency under indoor lighting.

Solar-Energy—System Overview

As discussed above, thin-film semiconductors (e.g., organics, a-Si, etc.) can be fabricated at low-cost on plastic foils, enabling conformal sheets spanning large areas. This may result in inexpensive solar cells for harvesting substantial power. Such power electronics are typically implemented in discrete modules. By integrating all power circuits using a-Si thin-film transistors (TFTs), it is possible to provide complete functionality for a wireless device-charging station configure in a flexible monolithic sheet that may be applied onto arbitrary surfaces. Thin-film systems may be implemented for power metering and energy harvesting (by combining separate device technologies). The embodiments disclosed below provide an approach to integrate harvesting sources and circuits in the same a-Si technology (the dominant thin-film technology).

Since the TFTs have very low performance compared to crystalline silicon devices, several challenges are raised for power circuits. First, low currents limit the power that can be delivered. Second, low speeds (typical $f_T$ is 1 MHz) lead to low inductor quality factors. Third, only unipolar devices are typically available (either n-channel or p-channel), which limits the gating of currents in switching topologies.

Figure 8:
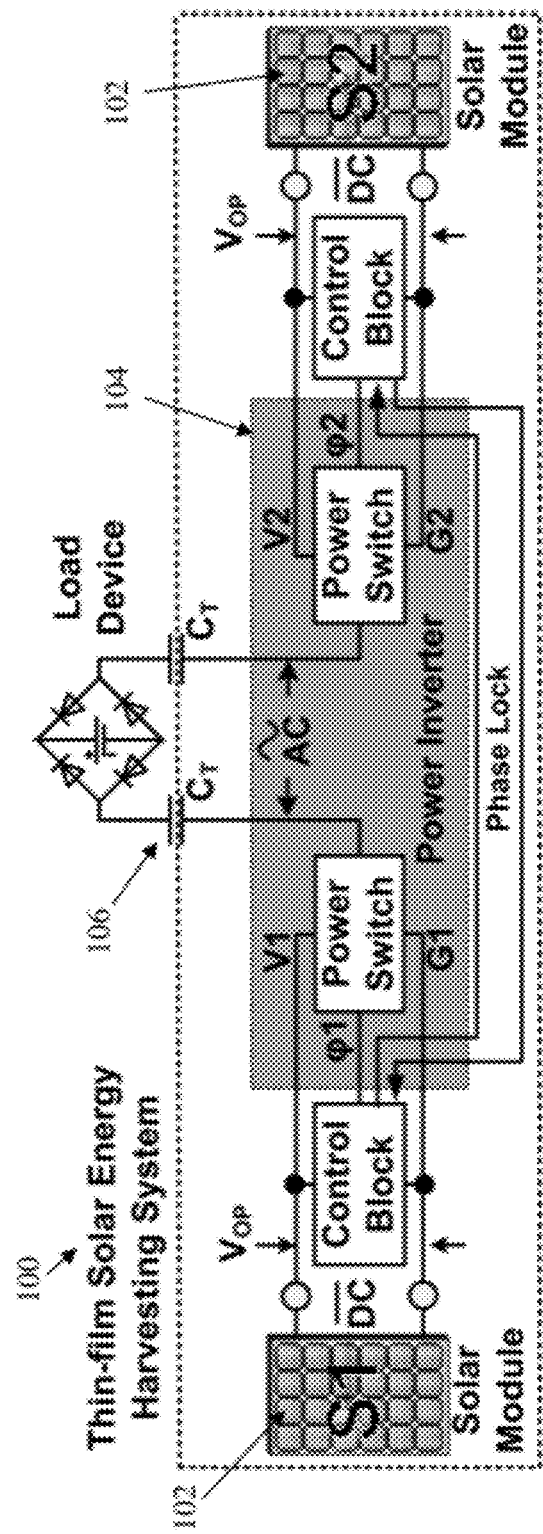
FIG. 8 is a block diagram of solar-harvesting sheet configured for device charging.

FIG. 8 is a block diagram of solar-harvesting sheet configured for device charging. The system 100 overcomes the challenges set out above and generates AC power using a power inverter and control circuits, all powered by the solar modules (S1/S2). In this example, each module includes a plurality of solar-cells 102 connected in series and operates at an output voltage VOP of 8.4V. AC power is then wirelessly delivered to load devices via transfer capacitors (CT) 106. The power is then stored on the load devices using a simple rectifier circuit (as shown). Load devices may include a variety of electronic devices such as a battery configured to store electrical energy. Load devices may also include ICs as disclosed above. For example, the ICs 12 in sensor system disclosed in FIG. 1 may be powered by the circuitry shown in FIG. 8.

Power Inversion and Control Circuits

Figure 9:
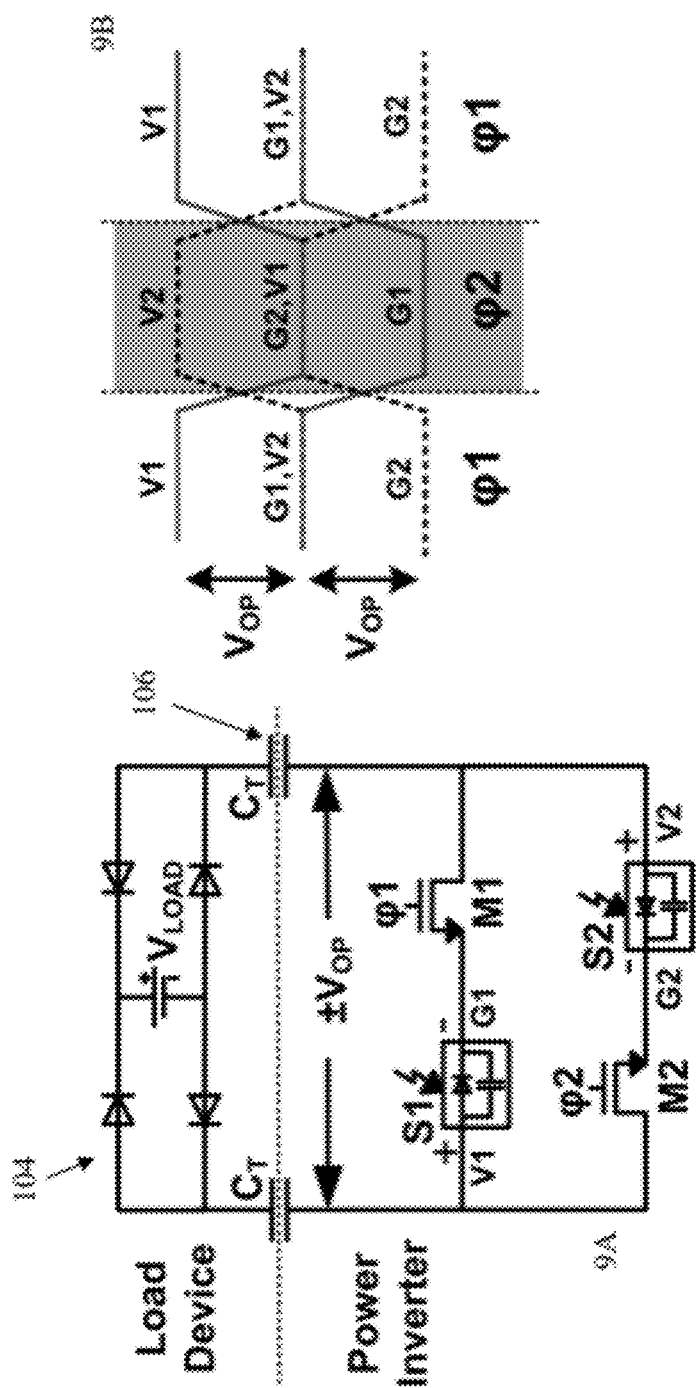
FIG. 9 is a block diagram of a power inverter circuit.

FIG. 9 is a block diagram of a power inverter circuit 104. To generate an AC output current, the two solar modules S1 and S2 are used. The anodes (V1 and V2) are directly connected to transfer capacitors 106, and only the return path currents are switched at the cathodes via NMOS TFTs (power switches) M1, M2. Power switches M1 and M2 switch in counter-phase, alternatingly drawing current from S1 and S2. Using two solar modules in this way enables a topology free of inductors and PMOSs (which are difficult to realize in a-Si). The output current is set by NMOS power switches, which maximizes the current, and all of the S1, S2 current is delivered to the load, yielding high power-inverter efficiency.

Figure 10:
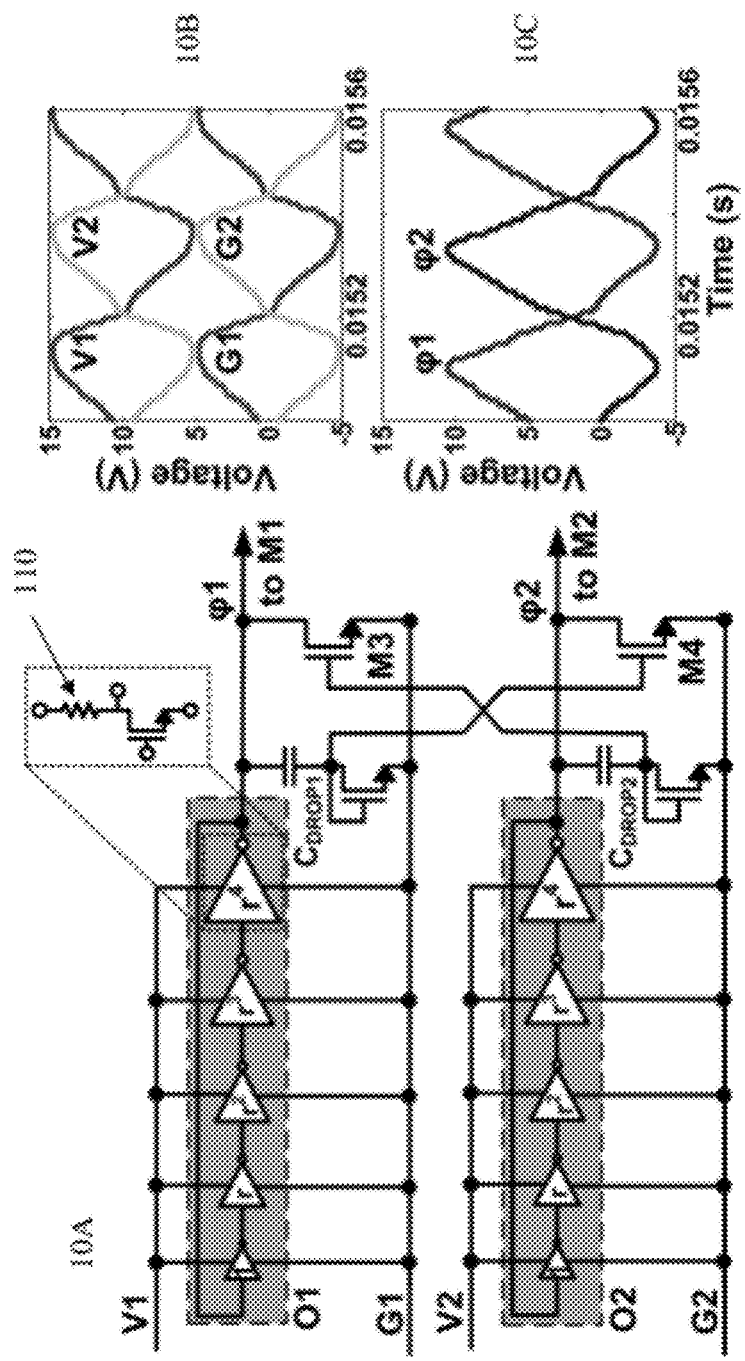
FIG. 10 shows coupled oscillators configured to generate non-overlapping control signals.

Waveforms are shown in FIG. 9B. This approach results in switching connections between G1/V2 and G2/V1, causing the nodes to oscillate with respect to each other. With oscillating source nodes, M1 and M2 may be difficult to control simultaneously. To achieve synchronized, non-overlapping control signals (φ1 and φ2), the coupled oscillators (O1 and O2) shown in FIG. 10 are used. In this example, each oscillator is formed using five NMOS stages with pull-up resistors. The oscillators are separately powered by S1/S2, and their last stages are cross-coupled via pull-down devices (M3/M4). These ensure that one of the φ control signals is de-asserted before the other can be asserted.

During φ1, V1/G1 are raised compared to V2/G2, as shown in the simulation waveforms 10B and 10C. When φ1 is de-asserted by the inverter-delayed path (O1), M4 is switched off. The correct voltage levels required to control M4 are achieved through CDROP1. This causes φ2 to be asserted, allowing V2/G2 to rise (due to the switching of M1/M2). Then, φ1 is held low through control of M3 (with the correct voltage levels set by CDROP2).

Analysis and Optimization

With the power inverter outputs oscillating to ±VOP (as desired), the output power to the load, assuming a regulated load voltage ($V_{LOAD}$) and an oscillator frequency of $f_{OSC}$, is:

$$P_{LOAD}=I_{OUT}V_{LOAD}=2(V_{OP}-V_{LOAD})C_T f_{OSC}V_{LOAD}, \quad (1)$$

and the power drawn from S1/2 by the power inverter is:

$$P_{INVERTER}=I_{OUT}V_{OP}=2(V_{OP}-V_{LOAD})C_T f_{OSC}V_{OP}. \quad (2)$$

The power-inverter efficiency is thus the ratio $V_{LOAD}/V_{OP}$. In an energy-harvesting system, however, the output power is typically a more important metric; $P_{LOAD}$ is optimized at $V_{LOAD}=V_{OP}/2$, as can be seen from equation (1).

Additional power is consumed by the coupled oscillators, whose static current is set by the pull-up resistors 110. Resistor values are chosen based on desired frequency and the stage capacitances of the NMOS devices, which are ultimately sized to drive the load capacitances of the power switches ($C_{M1/2}$). From simulation, an optimal stage up-sizing factor (r) of 1.6 is chosen. The resulting oscillator power is given by:

$$P_{OSC} = k C_{M1/2} f_{OSC} V_{OP}, \quad (3)$$

(with k as a scaling constant), and overall efficiency is given by:

$$\eta = \frac{2(V_{OP} - V_{LOAD}) C_T f_{OSC} V_{LOAD}}{2(V_{OP} - V_{LOAD}) C_T f_{OSC} V_{OP} + k C_{M1/2} f_{OSC} V_{OP}}. \quad (4)$$

Figure 11B:
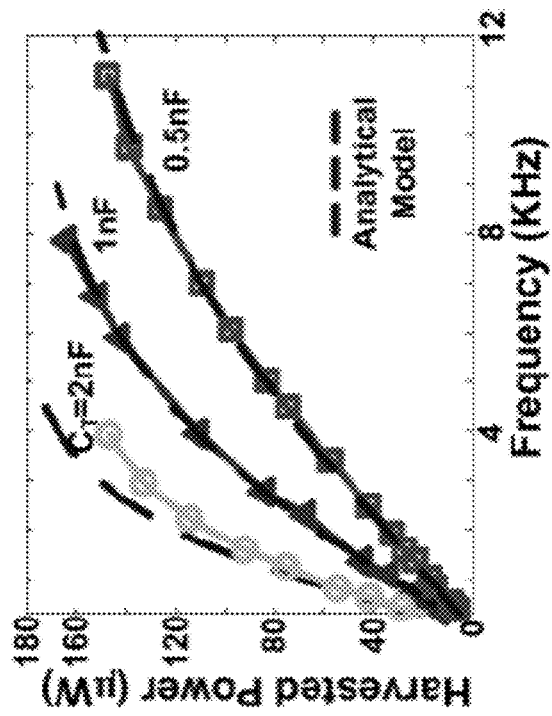
FIG. 11B is a graph showing output power versus oscillator frequency.
Figure 11A:
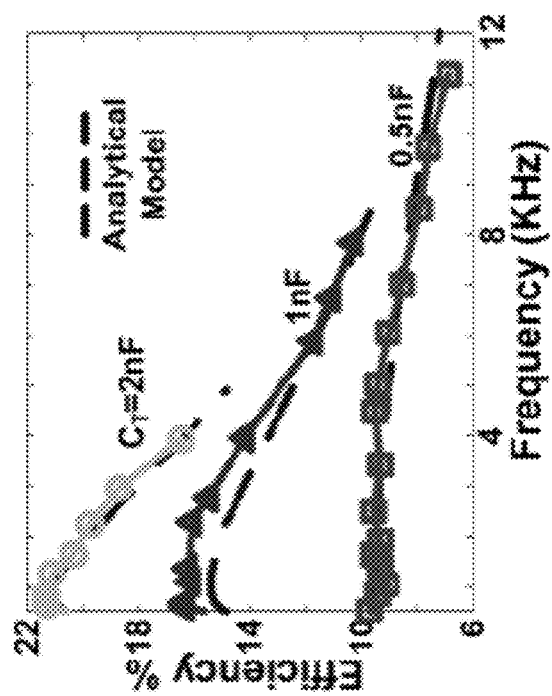
FIG. 11A is a graph showing efficiency versus oscillator frequency.

FIG. 11A is a graph showing efficiency versus oscillator frequency. FIG. 11B is a graph showing output power versus oscillator frequency. FIGS. 11A and 11B show the effect of scaling $C_T$ and $f_{OSC}$, from analysis and simulation (via Level 61 SPICE models from fabricated TFTs). In order to increase $\eta$, $C_T$ must be increased; as shown in equations (1) and (4), this permits higher output power without increasing $P_{OSC}$. Raising $f_{OSC}$ does not affect 1, until the point where M1/M2 can no longer fully charge the outputs to $\pm V_{OP}$; the analytical model shown accounts for this. $f_{OSC}$ may be increased to this point for highest output power. As shown in FIGS. 11A and 11B, however, the maximum harvested power ($P_{LOAD}$) achievable is limited ultimately by the saturation current of the M1/M2 power switches. Further output power requires up-sizing M1/M2. This also increases $P_{OSC}$, thus cancelling the effect on $\eta$.

Thin-film Processing

Figures 12A, 12B:
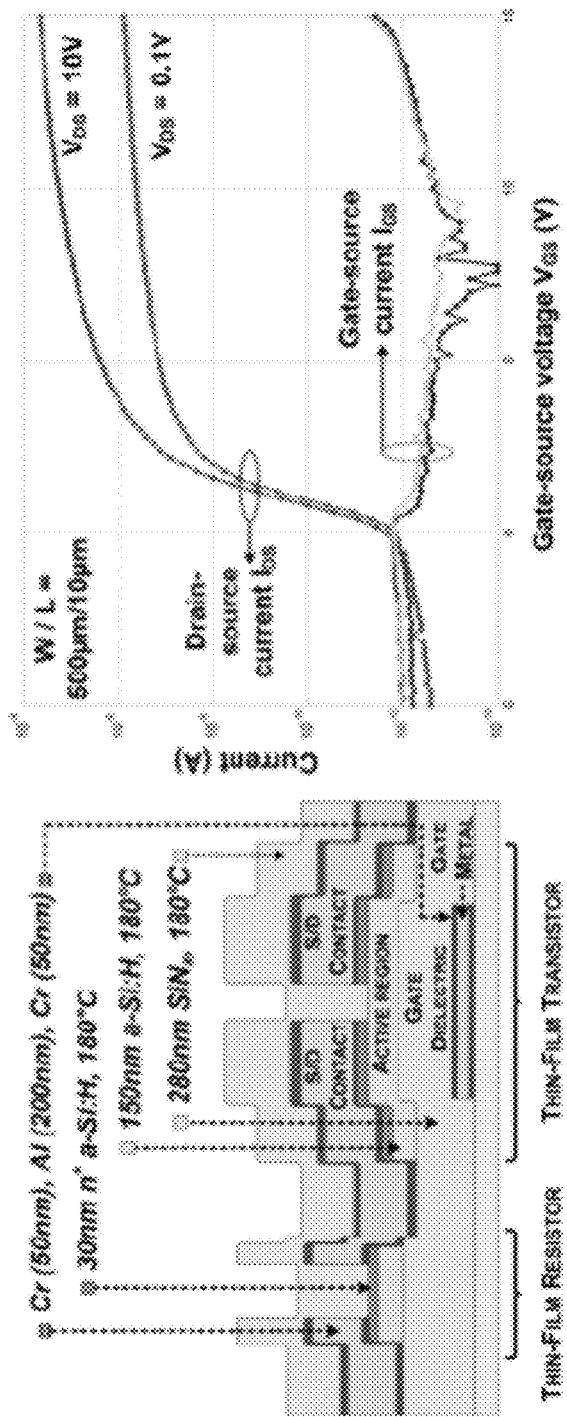
FIG. 12A is a block diagram showing the structure of the a-Si NMOS TFTs.
FIG. 12B is a graph showing measured I-V curves for a typical TFT shown in FIG. 12A.

FIG. 12A is a block diagram showing the structure of the a-Si NMOS TFTs and integrated resistors (used in O1/O2)—low-temperature processing of a-Si resistors and NMOS TFTs. In this example, the TFT channel length is 6 μm, and the layout is optimized for minimum gatesource/drain capacitance. FIG. 12B is a graph showing measured I-V curves for a typical TFT.

In this example, the resistors use an n+ doped 30 nm a-Si layer, which also serves to form Ohmic TFT source/drain contacts. The resulting sheet resistance is 0.25MΩ/sq. Fabrication may be achieved by plasma-enhanced chemical vapor deposition at low temperature (180° C.), enabling deposition on flexible 50 μm thick polyimide foil. Metal layers may use chrome-aluminum-chrome stacks to maintain electrical properties under flexing.

Measurement Results

Figures 13A, 13B, 13C:
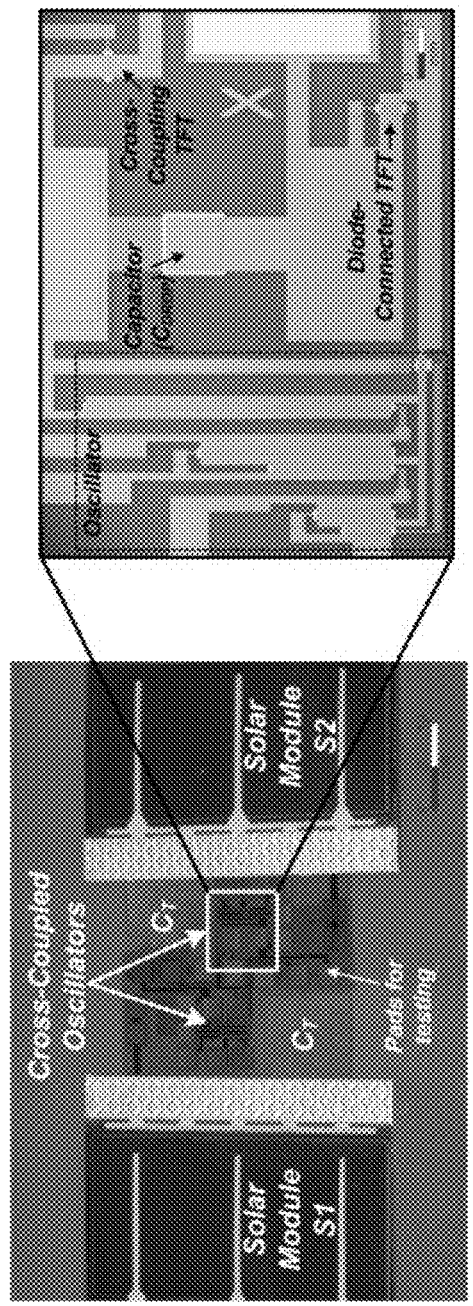
FIGS. 13A and 13B are diagrams of circuits fabricated and combined with solar modules on a flexible polyimide foil.
FIG. 13C is a table that summarizes power and efficiency for $C_T$ from 0.5 nF-2 nF.

The circuits are fabricated and combined with solar modules on a flexible polyimide foil as shown in FIGS. 13A and 13B. The table shown in FIG. 13C gives a summary, with power and efficiency quoted for $C_T$ from 0.5 nF-2 nF.

Figure 14B:
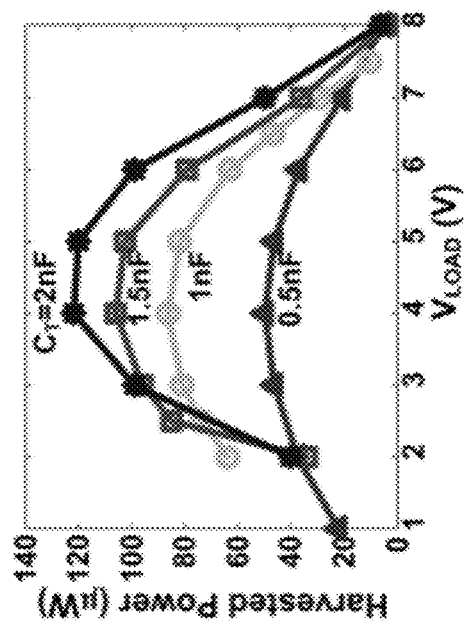
FIG. 14B is a graph showing output power versus $V_{LOAD}$.
Figure 14A:
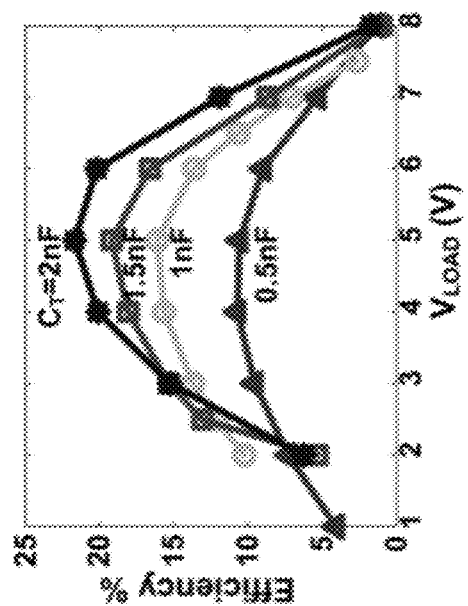
FIG. 14A is a graph showing efficiency versus $V_{LOAD}$.
Figure 15B:
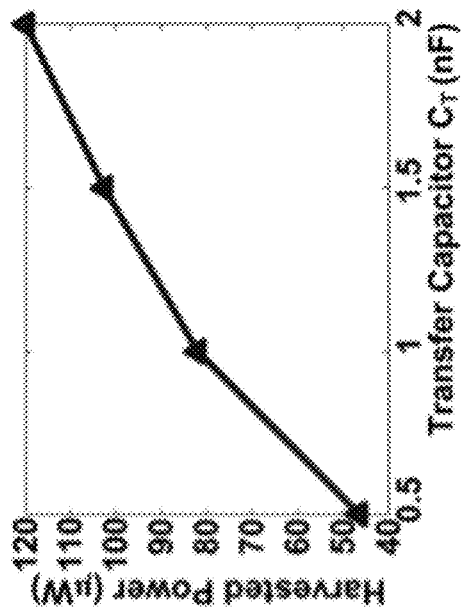
FIG. 15B is a graph showing output power versus $C_T$.
Figure 15A:
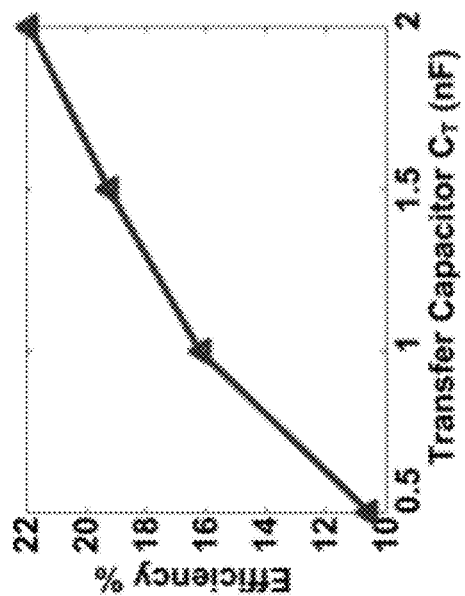
FIG. 15A is a graph showing efficiency versus $C_T$.

As explained above, for maximum power and efficiency the system may be operated at the highest $f_{OSC}$ that permits output charging to ±VoP. In this example $f_{OSC}$ is set to 4.5 kHz. FIG. 14A is a graph showing efficiency versus $V_{LOAD}$. FIG. 14B is a graph showing output power versus $V_{LOAD}$. Both graphs are plotted for various $C_T$ values, as $V_{LOAD}$ is swept. $V_{LOAD}$ is optimized at $V_{OP}/2$ for output power and slightly higher for efficiency. FIG. 15A is a graph showing efficiency versus $C_T$. FIG. 15B is a graph showing output power versus $C_T$. The graphs show the measured maximum efficiency and output power versus $C_T$, illustrating that efficiencies beyond 22% and output powers beyond 120 μW are readily achievable.

It should be understood that various sensor configurations may be used with the embodiments disclosed above. In one embodiment a stick-on sensor node may be used, e.g., for environmental monitoring, industrial monitoring, and/or healthcare monitoring. Such devices may use flexible large area electronics fabricated on low-cost plastic for providing energy-harvesting, sensing, and circuit functionality. As discussed above, low-power Si-CMOS integrated circuits may also be embedded to provide node control and communication functionality, enabling a semi-autonomous, low-cost node. Such devices may be made by fabricating electronics using thin-film processing techniques and by flip-chip or wire bonding a custom IC, e.g., fabricated using commercial services. Each of such devices may function as an independent node that can be readily stuck to desired surfaces.

In one embodiment, a very low cost stick-on sensor includes a thin-film energy harvester (e.g., photovoltaic, piezoelectric, etc.), silicon integrated circuits (ICs) for control and communication, functional thin-film electronics, and an embedded or patterned sensor. The components may be fabricated or bonded on a plastic substrate (e.g., polyimide) that includes patterned metal to which the IC(s) are wire-bonded or flip-chip bonded using standard integrated circuit packaging/assembly techniques.

The reverse side of the polyimide substrate has a layer of adhesive so that the structure may be stuck to any suitable surface (e.g., walls, windows, industrial equipment, etc.). Possible applications include industrial equipment monitoring, building environment monitoring, healthcare monitoring, etc.

Figure 16:
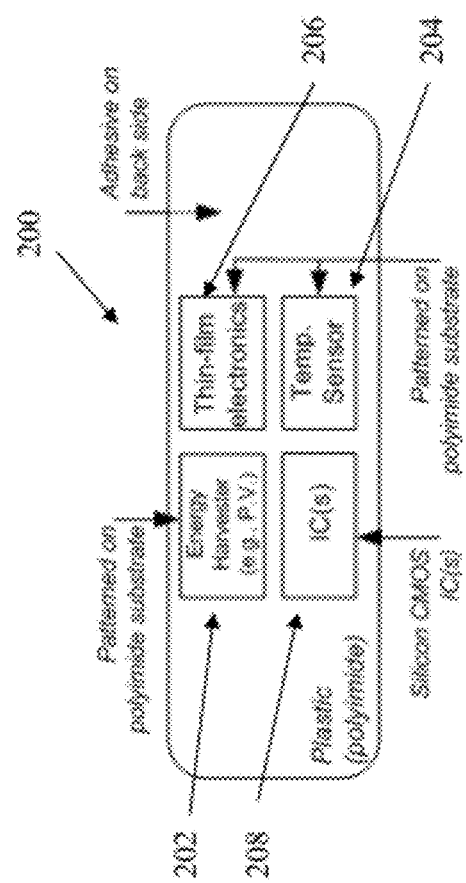
FIG. 16 shows a block diagram of a sensor node.

FIG. 16 shows a block diagram of a sensor node 200. The sensor node includes an energy harvester 202, sensor 204, functional electronics 206 and integrated circuit(s) 208. The thin film based circuitry bay be interfaced to the ICs using the techniques disclosed above.

Energy harvester 202 may be based on a thin-film photovoltaic (silicon, organic, etc.), piezoelectric, etc. patterned directly on the flexible plastic (polyimide) foil. Energy harvester 202 is configured to provide power to the ICs 208 for sensor node operation.

A transducer or sensor 204 such as a temperature, humidity, particulate, etc. may be patterned either directly on the flexible polyimide substrate using thin-film processing of silicon, organics, etc., or integrated on the silicon IC.

Functional electronics 206 may be based on thin-film transistor (TFT) circuits. Functional electronics 206 may be patterned directly on the flexible polyimide substrate. The functional electronics 206 may be configured to provide sensor readout functionality and power conversion functionality for the energy harvester 202.

IC(s) 208 may include one or more silicon die fabricated using high performance CMOS processing. The IC(s) may provide sensor instrumentation, node control, and communication functionality. Sensor instrumentation may include current or voltage readout circuitry and an analog-to-digital converter. Node control may be accomplished via an embedded low-power microcontroller. Communication may be provided via a low-power, low-data-rate transceiver such as a 2.4 GHz (ZigBee) radio. The radio antenna may be directly patterned on the flexible polyimide substrate.

Structural Health Monitoring

Figure 17:
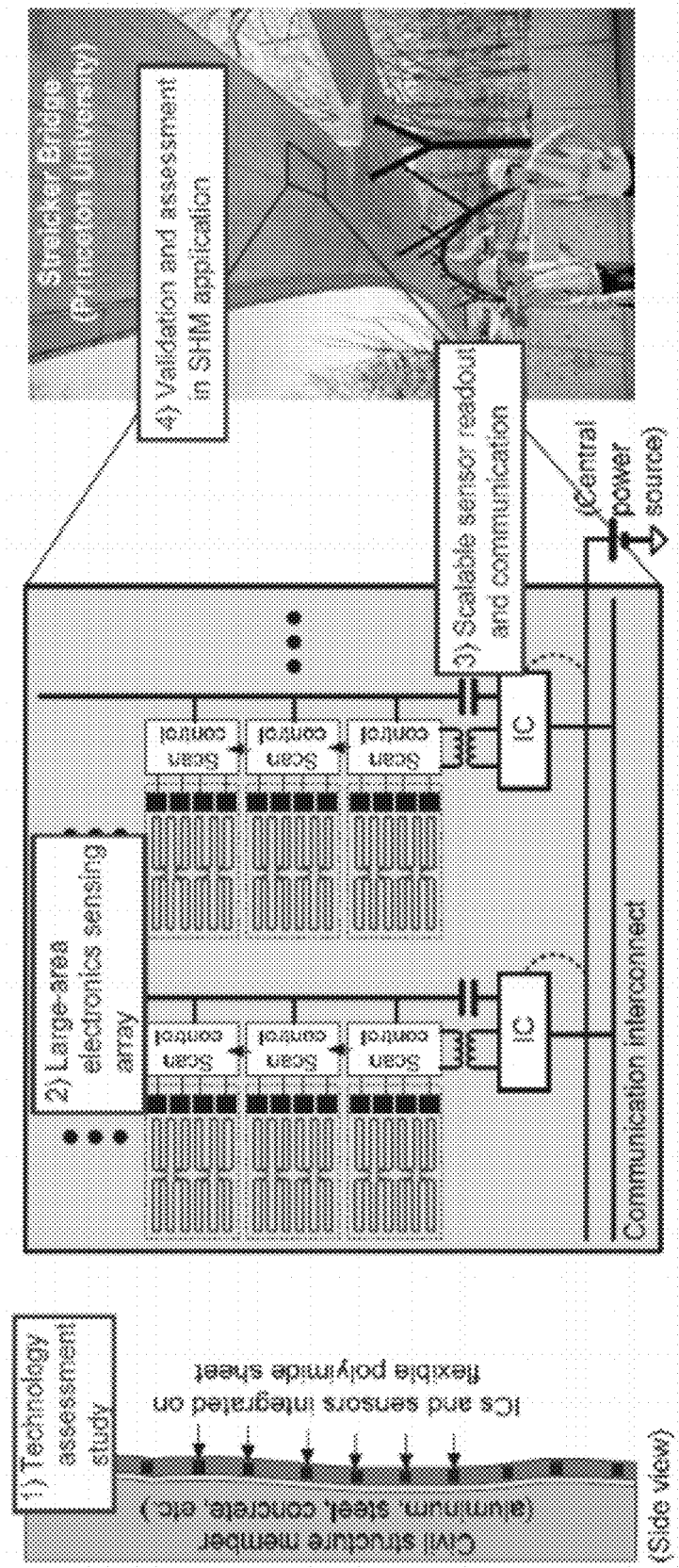
FIG. 17 is a diagram of an LAE sheet formed with a sensor array configured to measure a two-dimensional strain field with high-spatial resolution over large parts of a surface.

It should be understood that a variety of substrate (LAE sheet) configurations are possible. For example, the substrate may be formed with a sensor array configured to measure a two-dimensional strain field with high-spatial resolution over large parts of a surface as shown in FIG. 17. The disclosed technology may be used for structural health monitoring of large civil engineering structures, e.g., for companies that manufacture modular structures, components, and materials for construction, as well as in aerospace and military applications.

Current sensing technologies are based on sparsely placed discrete (point) sensors that provide limited sensing resolution or that are capable of only one-dimensional distributed sensing of strain field (e.g., fiber optic sensors). The ability to monitor two-dimensional strain field with high resolution has been shown to add substantial value in structural health monitoring.

High-resolution monitoring of two-dimensional strain field over large areas of the structure allows for direct damage detection, which is extremely robust to stray environmental interferences, thus providing a unique mode to reliably assess the condition of practical, in-use structures. Additionally, the disclosed technology enables embedded processing and analysis of the sensed data so that only critical and on-demand information may be transmitted to human supervisors, and is a very reliable monitoring technology that can be deployed and utilized with very low cost.

Resistive electrical strain-gauges may be either laminated or directly patterned onto a substrate, e.g., a polyimide sheet. Metal and functional electronics may be patterned via thin-film processing to develop electronic circuits for sensor readout and control. Silicon CMOS ICs packaged on flexible substrates may be bonded to the sheet to provide readout and processing of the sensor outputs. The integrated circuits may also communicate with each other and with base-station devices via metal wires patterned on the polyimide sheet.

FIG. 17 shows a flexible sensing sheet configured for structural health monitoring. The sensing sheet includes (1) dense 2D-distributed arrays of resistive strain gauges on a flexible substrate, e.g., polyimide, combined with functional large-area electronics and (2) ICs for automatic readout. The ICs may be powered by a central energy source, e.g., a battery that distributes power over patterned interconnect on the large-area electronics. The IC's may also be solar powered as discussed above. The polyimide substrate allows conformability to the surface of the monitored structure as well as resilience to extreme outdoor temperature conditions (−40° C. to +80° C.).

As an example, a 0.1 mm crack detected by a sensor with a gauge length of 100 mm will induce an average strain change of 0.1/100=0.001=1000 microstrain, which is too high to be masked by environmental influences or by monitoring-system noise. In addition, measurements from surrounding undamaged material will permit analysis of relative differences, improving the prospects of overcoming false positives (increasing specificity) as well as false negatives (increasing sensitivity). By providing global information over large parts of the structure, the sensors can help inform decisions on whether repair is necessary, based on the extent and magnitude of the damage. Identification of the failure mode and/or the cause of the damage may then be pursued via additional directed measurements and data analysis.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. It should be understood that such processors may be coupled to memory devices and input/output circuitry as is well known in the art. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

Although features and elements are described above in particular combinations, each feature or element may be used alone without the other features and elements or in various combinations with or without other features and elements.

What is claimed is:

1. An electronic device comprising:
   a thin film large area electronic (LAE) device disposed on an LAE sheet;
   a complementary metal-oxide-semiconductor (CMOS) integrated circuit IC disposed on flex tape packaging;
   a non-contact interface comprising a first non-contact interface disposed on the LAE sheet for the LAE device and a second non-contact interface disposed on the flex tape packaging for the IC device, and coupled between the LAE device and the IC, wherein the LAE device has lower performance than the IC device, the non-contact interface being configured to provide at least one of a data acquisition path or control path between the LAE device and the IC.

2. The device of claim 1, wherein the LAE sheet is plastic based.

3. The device of claim 1, wherein the non-contact interface comprises at least one of an inductive or capacitive antenna.

4. The device of claim 1, wherein the LAE device comprises a plurality of LAE sensors and further comprises an LAE scan chain configured to acquired data from the plurality of LAE sensors.

5. The device of claim 1, wherein the LAE device comprises an LAE sensor configured to generate an alternating current (AC) sensor output and the IC comprises a demodulator configured to demodulate the AC sensor output.

6. The device of claim 5, further comprising an IC network configured to generate an AC bias for the LAE sensor.

7. The device of claim 1, further comprising a plurality of ICs, the LAE device comprising a communication path configured to support communication between the plurality of ICs.

8. The device of claim 1, wherein the LAE device comprises at least one of a sensor or an energy harvesting device.

9. The device of claim 1, comprising a plurality of strain-gauges disposed on the LAE sheet in a 2 dimensional pattern.

10. The device of claim 1, wherein the LAE device comprises an energy harvesting device and a sensor.

11. The electronic device of claim 1 wherein the LAE device and the IC operate at different voltages and the non-contact interface provides voltage step up to the LAE device.

12. A method of making an electronic device, the method comprising:
   forming a thin film large area electronic (LAE) device on an LAE sheet;
   coupling a complementary metal-oxide-semiconductor (CMOS) integrated circuit IC disposed on flex tape packaging to the LAE device;
   forming a non-contact interface comprising a first non-contact interface disposed on the LAE sheet for the LAE device and a second non-contact interface disposed on the flex tape packaging for the IC device, and coupled between the LAE device and the IC device, wherein the LAE device has lower performance than the IC device, the non-contact interface being configured to provide at least one of a data acquisition path or control path between the LAE device and the IC.

13. The method of claim 12, wherein the LAE sheet is plastic based.

14. The method of claim 12, wherein the non-contact interface is formed with at least one of an inductive or capacitive antenna.

15. The method of claim 12, wherein the LAE device comprises a plurality of LAE sensors and further comprises an LAE scan chain configured to acquired data from the plurality of LAE sensors.

16. The method of claim 12, wherein the LAE device comprises an LAE sensor configured to generate an alternating current (AC) sensor output and the IC comprises a demodulator configured to demodulate the AC sensor output.

17. The method of claim 12, further comprising coupling an IC network to the LAE sheet, the IC network being configured to generate an AC bias for the LAE sensor.

18. The method of claim 12, further comprising coupling a plurality of ICs to the LAE sheet, the LAE device being formed with a communication path configured to support communication between the plurality of ICs.

19. The method of claim 12, wherein the LAE device comprises at least one of a sensor or an energy harvesting device.

20. The method of claim 12, further comprising forming a plurality of strain-gauges disposed on the LAE sheet in a 2 dimensional pattern.

21. The method of claim 12, wherein the LAE device comprises an energy harvesting device and a sensor.

22. The method of claim 12 wherein the LAE device and the IC operate at different voltages and the non-contact interface provides voltage step up to the LAE device.

23. An electronic device comprising:
a LAE thin film energy harvesting device disposed on an LAE sheet;
LAE thin film power inversion and control circuits disposed on the LAE sheet;
a first non-contact interface disposed on the LAE sheet and a second non-contact device disposed on flex tape packaging for a complementary metal-oxide-semiconductor (CMOS) load device, and coupled between the LAE thin film energy harvesting device and the CMOS load device, wherein the LAE thin film energy harvesting device has a lower energy efficiency than the CMOS load device.

24. The device of claim 23, wherein the CMOS load device further comprising a battery.

\* \* \* \* \*